US006790482B2

(12) United States Patent
Maass

(10) Patent No.: US 6,790,482 B2
(45) Date of Patent: Sep. 14, 2004

(54) ARRANGEMENT FOR ORIENTING THE MAGNETIZATION DIRECTION OF MAGNETIC LAYERS

(75) Inventor: Wolfram Maass, Linsengericht/Grossenhausen (DE)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 10/336,514

(22) Filed: Jan. 3, 2003

(65) Prior Publication Data

US 2003/0129104 A1 Jul. 10, 2003

Related U.S. Application Data

(63) Continuation of application No. PCT/CH01/00411, filed on Jul. 3, 2001.

(30) Foreign Application Priority Data

Jul. 6, 2000 (CH) .............................................. 1338/00

(51) Int. Cl.[7] .......................... B05C 11/00; C23C 14/35
(52) U.S. Cl. ...................... 427/445; 118/500; 118/506; 204/298.16
(58) Field of Search .................... 204/192.1, 298.06, 204/298.15, 298.16; 427/445; 118/500, 506; 156/345.51; 422/186.01

(56) References Cited

U.S. PATENT DOCUMENTS

| 4,600,488 A | | 7/1986 | Imura et al. ............. 204/192 N |
| 5,630,916 A | | 5/1997 | Gerrish et al. ........... 204/192.2 |
| 6,042,707 A | * | 3/2000 | Moslehi et al. ......... 204/298.16 |
| 6,106,682 A | * | 8/2000 | Moslehi et al. ......... 204/298.15 |

FOREIGN PATENT DOCUMENTS

EP           0 406 667 A1    1/1991    ............. B44C/1/00

* cited by examiner

*Primary Examiner*—Steven VerSteeg
(74) *Attorney, Agent, or Firm*—Notaro & Michalos P.C.

(57) ABSTRACT

An arrangement and method orients the magnetization direction of magnetic layers on a plate shaped substrate on a mounting. The mounting defines a positioning plane for the substrate and a magnet arrangement is on one side of the positioning plane. The magnet arrangement has at least three electromagnets whose dipole axes are at least approximately parallel to the positioning plane and, viewed perpendicularly to the positioning plane, define a closed surface.

31 Claims, 7 Drawing Sheets

ARRANGEMENT FOR ORIENTING THE MAGNETIZATION DIRECTION OF MAGNETIC LAYERS

This application is a continuation of PCT/CH0/00411, Jul. 3, 2001.

Field and Background of the Invention

The present invention relates to an arrangement for orienting the magnetization direction of thin layers on plate-form substrates with a substrate mounting for at least one substrate, which defines a positioning plane for the at least one substrate, and in which, on one side of the positioning plane, a magnet arrangement is provided; such according to the claims.

The invention relates further to a vacuum coating installation a substrate with at least one magnetic layer method for the production of substrates as well as use of the arrangement.

In the production of magnetic layers, for example by cathode sputtering, it is often desirable to generate in these layers a magnetic anisotropy, which has a nominal distribution within and along the layer. As the nominal distribution especially frequently a uniaxial, i.e. collinear magnetic anisotropy is required, whose direction is defined with respect to the substrate.

By collinear anisotropy or collinear anisotropy distribution should be understood a magnetic anisotropy, which is directed uniformly along a considered layer domain. In this sense it is also possible to speak of a "homogeneity of the anisotropy".

Normally only small angular deviations of the anisotropy direction from the predetermined direction are permitted. Such an anisotropy in the magnetic layer is attained thereby that during the substrate coating a correspondingly directed or oriented magnetic field in the coating regions is brought into effect. After the coating the magnetic anisotropy in this case has the direction of the previously applied field.

It is known from DE-OS 196 43 841 to dispose substrates radially offset and distributed about the center on a substrate holder and to coat them in this disposition with a magnetic material. In this process the substrate holder is rotated about the central axis. Beneath the positioning plane for the substrates defined by the substrate mountings on the holder, radially oriented with respect to the central axis, is provided a stationary electromagnet with coil and yoke, which latter generates immediately under the positioning plane a magnetic field directed substantially radially to the central axis. This approach is of disadvantage under various aspects:

If larger substrates are to be coated, due to the disposition, which perforce is eccentric, and substrate holder rotation, the holder arrangement is extraordinarily large and mechanically expensive. The holder size has a disadvantageous effect on the coating rate, for example by means of sputter sources.

The production of substrates with multilayer coating systems of optionally differing magnetic materials connected with the requirement to realize in the differing magnetic layers different anisotropy distributions, in particular directions, cannot be realized with this known arrangement with exclusively radially directed magnetic fields, unless the substrates are repositioned in order to realize different anisotropy directions on different substrate layers.

U.S. Pat. No. 5,630,916 discloses providing beneath a positioning plane for substrates an electromagnet which extends far beyond the dimensions of the substrate. In order to generate collinear field lines in the substrate region, the dimension of the electromagnet must be markedly greater than the substrate dimension. Here also, there is no capability of impressing in the case of multilayer coatings on the substrate onto the discrete magnetic layers differing anisotropy distributions, in particular directions, without for this purpose geometrically rotating the substrate between the individual coating steps. As in all arrangements for magnetic field generation in the substrate region in which a closed yoke plate optionally with coils beneath the substrate plane is available, a further disadvantage comprises that it is difficult or impossible to bring to the substrate mechanical devices, for example for the substrate movement from below. But such devices are often required in modern coating installations, for example for the substrate transport. Similar problems are encountered if the substrate is to be cooled or heated from below or also for applying measuring instruments.

From DE-OS 43 12 444 is known a procedure, similar to that described in connection with DE-OS 196 43 841, in which the distance can be set between a radially disposed permanent magnet and the substrate eccentrically and rotationally supported.

EP-A-0 435 838 discloses providing coaxially to a substrate holder a polygonally wound, planar coil, with which on the centrally supported substrate a radial magnetic anisotropy is attained. The disadvantages already listed above essentially apply also to this arrangement.

From EP-A-0 584 768 is further known to generate a uniaxial anisotropy with small angular deviations on magnetically coated rectangular substrates thereby that parallel rod magnets are disposed laterally beneath the substrate. Here also a changing between nominal anisotropy distributions is not possible except, as in the previously described known procedures, through the mechanical rotation of the magnet arrangement with respect to the substrate, which can only be realized with considerable expenditures.

SUMMARY OF THE INVENTION

The present invention addresses the problem of proposing an arrangement or a coating installation or a production method, by means of which:

in simple manner a desired nominal anisotropy distribution can be realized on at least one magnetic layer of a substrate. In particular for the vacuum coating of a substrate with a low retentivity layer, the desired nominal anisotropy distribution is to be an anisotropy collinear in a predetermined direction;

without mechanical change of the relative position of substrate and magnet arrangement are to be realizable several low retentivity layers provided on a substrate with different anisotropy distributions, in particular directions, thereby that the anisotropy distribution or direction to be attained can be set in simple manner;

large-area substrates are to be imparted with desired magnetic anisotropy distribution, in particular with a collinear predetermined or predeterminable direction. More especially, in the case of large-area substrates with said layers, a very good collinearity of the anisotropy direction is to be attained at least to a high degree in the entire substrate region.

This problem is solved on the arrangement according to the invention where the magnet arrangement comprises at least three electromagnets, whose dipole axes are at least approximately parallel to the positioning plane and, viewed perpendicularly to the positioning plane, define a closed surface. It becomes thereby possible by superposition of the fields of the electromagnets and corresponding dimensioning and orientation of their dipoles, to realize in the positioning plane or in the corresponding magnetic layer of a substrate held on the substrate mounting, a desired resulting field line pattern or a nominal anisotropy direction distribution, and to switch it over extremely simply, for example for the imparting of a second layer, as will yet be explained.

In a preferred embodiment of the arrangement according to the invention the dipole axes are in a plane parallel to the positioning plane. They further, preferably additionally, define a regular n-polygon, and further preferred, more than three electromagnets are provided with n being the number of electromagnets.

In particular in view of the requirement to realize on said layers a homogeneous distribution of the anisotropy direction within maximally large regions of the layer, but, as previously, to be able to change this anisotropy with respect to its direction in extremely simple manner, it is proposed that an even number of electromagnets is provided, preferably a number divisible by 4, wherewith—as will yet be explained—the electromagnets, grouped in quadrants, can be optimally set and reset with respect to their dipole directions and dipole strengths with the utilization of symmetries.

In a further preferred embodiment the magnet arrangement comprises two electromagnet groups, on which the electromagnets generate dipoles directed as follows:

The dipoles—in the sense of vector components—have a first component, parallel to the positioning plane and in a first direction, which are directed uniformly on the electromagnets of both groups.

The dipoles have second components, parallel to the positioning plane and perpendicular to the first direction, which are directed on one group inversely to those of the second group, thus pointing in compensating directions between the groups.

Furthermore, in a preferred embodiment the electromagnets are formed by coils, which are wound on a common magnet core enwrapping said surface, therein preferably on a common toroidal core.

The calibrating of the dipole magnitudes or values at the electromagnets in a first embodiment takes place by providing coils which have at least partially different winding numbers.

The electromagnets are furthermore connected to current generators, which charge them with DC and/or AC and/or DC with superimposed AC current. If AC current is employed, optionally in superposition with DC current, then preferably with a frequency f, to which applies:

$1 \text{ Hz} \leq f \leq 100 \text{ Hz}.$

Instead of, or supplemental to, the setting of the dipole magnitude on the provided electromagnets by providing coils of different winding numbers, a second embodiment proposes that at least one portion of the electromagnets is connected to current generators, which charge the electromagnets with currents, to which applies:

the DC current values are different and/or the AC current amplitudes and/or phases are different.

Consequently, with a provided set of electromagnets the desired anisotropy distribution, in particular the desired anisotropy direction, can be attained by the redirecting of the currents acting upon the electromagnet coils.

Therefrom follows directly a further preferred embodiment of the arrangement according to the invention, in which the electromagnets are connected to a current generator arrangement, at which the distribution of output currents to the electromagnets can be switched over into at least two differing distribution states. It is understood that it is possible to define more than two current distribution states and to redirect the anisotropy direction virtually in any desired direction from 0° to 360° in the positioning plane. By distribution of the output currents of the generators are understood the distribution of DC values or AC amplitudes or mutual phase position of the currents as they are generated at a predetermined set of electromagnets.

If coils of the electromagnets are wound on a common toroidal core, preferably an even number of coils, in particular a number divisible by 4, and if a plane of symmetry, which contains the axis of the toroidal core, divides the coils into two groups, with direction components of the dipoles of the coils of both groups being directed uniformly in the direction parallel to said plane of symmetry, the strength of the dipoles is preferably selected at least approximately proportional to a cos $\phi$ function, wherein $\phi$ is the polar position angle of the particular coil with respect to the axis of the toroidal core.

If therefore one follows along the coils of a group around the toroidal core, as stated the values of said dipoles are preferably laid out according to said cos $\phi$ function. Thereby the circular arrangement of the coils is taken into consideration, in view of the generation of a resulting collinear anisotropy. The anisotropy direction is obtained in the direction of the line of intersection of said plane of symmetry with the positioning plane.

It is now readily evident that by switching-over the distribution of the currents flowing through the coils, the angular position of said plane of symmetry is pivotable about the toroidal core axis into predetermined angular positions and/or is freely selectable, preferably in steps, in the range from 0° to 360°.

For while the electromagnets are stationary, as is also the substrate on the positioning plane, through the current-directed redefinition of said plane of symmetry an adjustment is obtained of the resulting anisotropy direction in the positioning plane or on the substrate.

In order to be further able to change rapidly from one preferred nominal anisotropy distribution or direction to another, in particular from the generation of a collinear anisotropy in a first direction to the generation of a collinear anisotropy in another and in order to herewith generate for example in two magnetic layers of a substrate, first, a collinear anisotropy in the one, subsequently in the second layer in a second direction, for example rotated by 90°, it is proposed that at least two of the magnet arrangements are provided, each of which is operated selectively.

In addition to the above described thereby a further feasibility for the direction switching of the anisotropy direction results, according to which this change is carried out on one and the same electromagnet set by redirecting the dipole-generating currents. It is understood that it is readily possible to provide optionally two or more of said magnet arrangements, to operate these alternatively or optionally even together and, in addition, to set or redirecting the currents generating the dipole on the electromagnets of said magnet arrangements.

In a preferred embodiment of the arrangement according to the invention with two of the magnet arrangements, it is proposed that the magnet arrangements are disposed coaxially with respect to an axis perpendicular to the positioning plane, and are preferably identical, but with respect to this axis are rotated mutually about an angle of preferably 90°. Thereby, in particular in the case of the above defined plane of symmetry on a toroidal core, by each of the magnet arrangements a plane of symmetry is defined, which are oriented differently, as stated, preferably form a 90° angle. Thereby the capability is obtained of redirecting by 90° the resulting field direction or anisotropy direction in simple manner in one switch-over step.

An extremely compact structure, in which additionally identical conditions obtain with respect to the positioning planes for both magnet arrangements, is attained thereby that coils of both magnet arrangements are wound on the same core, preferably a toroidal core.

On the arrangement according to the invention the substrate mounting is preferably developed for receiving at least one plate-form substrate, which is preferably rectangular or, and especially preferred, circular. However the substrate mounting can quite well be developed for receiving several plate-form substrates. But, in any event, the magnet arrangement or the two or more magnet arrangements are preferably disposed symmetrically to a center axis through the substrate mounting. If the substrate mounting is developed for receiving one substrate, this is provided on the mounting centered with respect to said center axis, if several substrates are provided on the mounting, then analogously about said axis centered in groups.

Since with the arrangement according to the invention in said positioning plane a collinear field line pattern over a large area can be realized and therefrom correspondingly over a large area a collinear anisotropy distribution on the layer(s) of a substrate, in a preferred embodiment the substrate mounting can be developed for receiving at least one plate-form substrate with a maximum diameter of at least 100 mm, preferably of at least 150 mm, preferably even of 200 mm or even of 300 mm.

The arrangement according to the invention in the preferred embodiment in and along said positioning plane of the substrate mounting, in particular along areas corresponding to the listed substrate dimensions, generates a magnetic field with collinear field lines which deviate at most ±5°, preferably at most±3°, preferably even at most ±2° from the ideal collinearity or parallelity.

A coating installation according to the invention is also distinguished. For the reception of at least one substrate to be coated in the coating chamber it comprises an arrangement of the above described type. In a preferred embodiment the coating installation in the chamber comprises at least one sputter source with a target of a magnetic, preferably low retentivity material.

A substrate according to the invention with at least one magnetic layer is distinguished as well. The substrate according to the invention in a preferred embodiment comprises at least two magnetic layers each with said magnetic anisotropy preferably in different directions.

The method according to the invention is furthermore distinguished according to other claims.

With the procedure according to the invention not only magnetic anisotropies can be generated which are highly exactly collinear and over a large area in magnetic substrate layers, but rather additionally the direction of this anisotropy can be changed extremely simply such that on substrates with two and more magnetic layers, each in different directions, collinear anisotropies can be generated without repositioning the substrates during the coating process.

The demand for such substrates with collinear anisotropies shifted by 90° exists for example in the production of magnetic sensors, such as are utilized in so-called thin-layer heads for fixed disks, in the field of sensory analysis of the motor vehicle field and in so-called MRAMs (Magnetic RAM, see for example Hubert Brückl "Non-Volatile Memory", Magnetic Storage Industry Sourcebook, 1999). Furthermore said demand is also made in the production of multilayer coating systems, which are structured according to the principle of "spin valve" (see B. Ocker, W. Maass et al., "Spin Valves for High Density", Magnetic Storage).

A further application of the invention is for the magnetic measurement techniques, in which for example the magnetic properties of magnetic layers or materials are measured. In these measurements it is in many cases necessary to apply collinear homogeneous magnetic fields in different directions onto the samples to be measured.

The procedure realized according to the invention in the above connection is consequently according to the use according to the invention suitable for all application purposes in which in a specific plane over a large area a specific magnetic field distribution is desired, especially again a homogeneous collinear field distribution over relatively areal domains, and for this purpose said plane is defined instead of the above described positioning plane.

BRIEF DESCRIPTION OF THE DRAWINGS

In the following the invention will be described by example in conjunction with Figures. Therein depict.

DESCRIPTION OF THE PREFERRED EMBODIMENT

Figure 1:
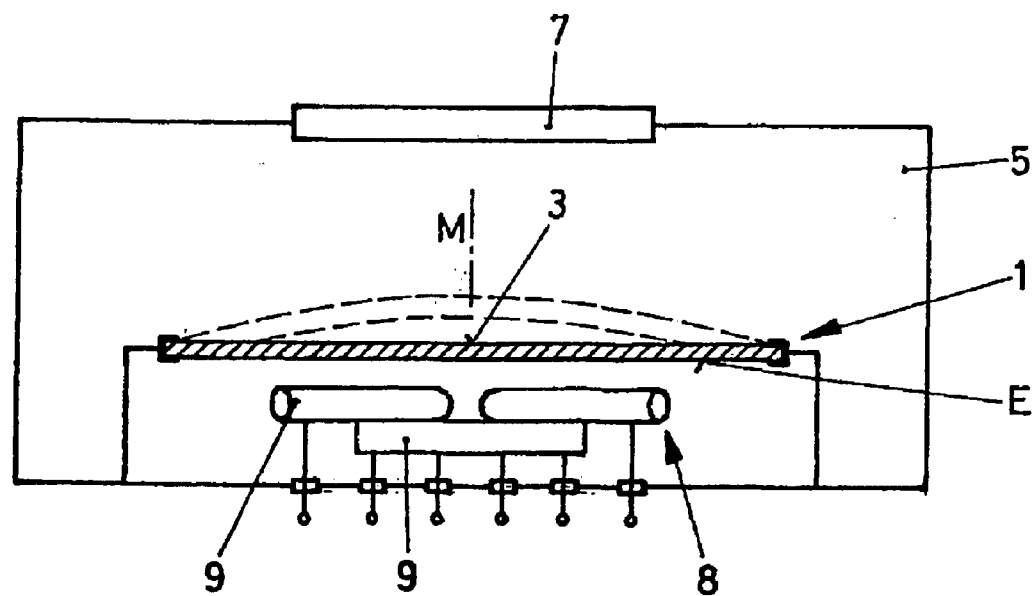
FIG. 1 schematically and in minimum configuration, an arrangement according to the invention for realizing the production method according to the invention of the substrates according to the invention, FIG. 2 schematic in top view the arrangement according to FIG. 1, FIG. 3 in top view, analogous to the representation of FIG. 2, a preferred embodiment of the arrangement according to the invention for the generation of large-area, collinear magnetic fields and therewith anisotropies, selectively switchable with respect to direction, FIG. 4 schematically the electric circuitry of the coils on the arrangement according to FIG. 3 with identical current loading of differently wound coils, FIG. 5 in cross section the coil arrangement in the realization according to FIG. 4, with coil sets to be selectively operated, FIG. 6 in a developmental representation in cross section the winding ratios in the realization according to FIGS. 4 and 5 for the direction switching of the realized anisotropy, FIG. 7 schematically the realization of the arrangement according to FIG. 3 with current switching to the coils for direction change of the realized anisotropy, FIG. 8 the magnetic anisotropy realized according to the invention on a circular plate-form low retentivity coated substrate, represented on the one half of the substrate, FIG. 9 a segment of a further preferred embodiment of the arrangement according to the invention, and FIG. 10 the cross section of a preferably formed-out flux guidance piece applied on the arrangement according to FIG. 9.

In FIG. 1 is shown schematically and in side view an arrangement according to the invention for the magnetization of thin layers in minimum configuration. The arrangement is shown in top view in FIG. 2. The arrangement according to the invention comprises a substrate mounting 1, on which—as shown in dashed lines—curved, however in the preferred application form in particular planar, substrates 3 are mounted. The substrate mounting 1 defines in any case a positioning plane E for substrates 3 formed in any desired shape. The mounting 1 in use is a part of a vacuum coating chamber 5 with a coating source 7, shown schematically in FIG. 1, preferably a sputter source, in particular a magnetron sputter source.

Beneath the positioning plane E, defined by the substrate mounting 1, the magnet arrangement 8 according to the invention is provided. It comprises at least three electromagnets 9 with the electrical terminals associated with their coils, as is schematically shown in particular in FIG. 2.

Figure 2:
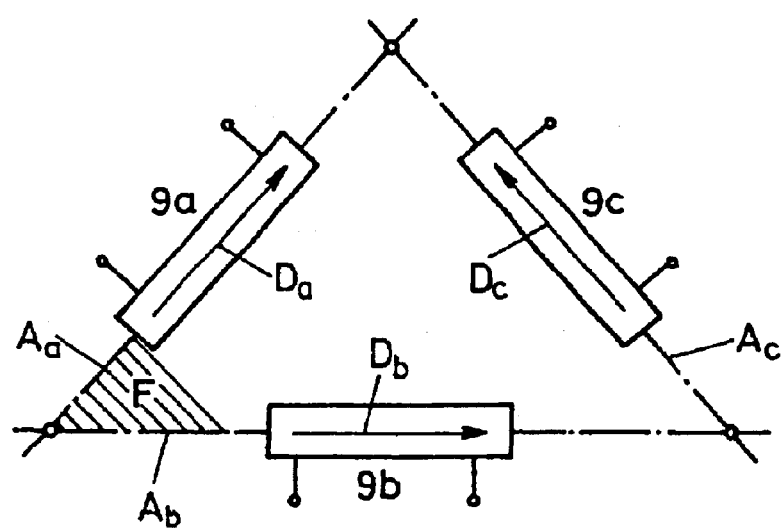

According to FIG. 2 each electromagnet $9a$ to $9c$ defines a magnetic dipole, corresponding to $D_a$ to $D_c$, which latter, in turn, defines magnetic dipole axes $A_a$ to $A_c$. As is readily apparent in FIG. 1, the electromagnets 9 do not absolutely have to lie with their dipole axes A in one plane, but it is far preferred. If they are not in one plane, as shown in FIG. 1, the effect of different distances to the plane E can be compensated by the magnetic field generated on the particular electromagnets 9.

But as is evident in FIG. 2, the dipole axes A of the provided electromagnets 9, in top view onto the positioning plane E, in any case frame a closed surface F.

Building on the minimum configuration according to FIG. 1, preferably more than three electromagnets are provided and, in the case of the number n, the dipole axes $A_{1-n}$ in the view according to FIG. 2, define an n-polygon, preferably a regular n-polygon.

Furthermore, the electromagnets are each formed by coils, which are wound jointly onto a magnetic core, preferably a toroidal core, enwrapping the surface F according to FIG. 2.

Although the FIGS. 1 and 2 have been explained in connection with the realization of a desired anisotropy distribution, in particular a collinear one, on one or several magnetic layers of a substrate, to a person skilled in the art it is readily evident that it is a condition of the realization of such an anisotropy distribution to attain in plane E a corresponding magnetic field distribution, in particular a collinear homogeneous magnetic field distribution. Therewith this and the device described in the following can be applied wherever correspondingly over a large area—as will yet be explained—a homogeneous collinear magnetic field distribution in a plane corresponding to E is desired which, with respect to its direction, can be set in simple manner.

Figure 3:
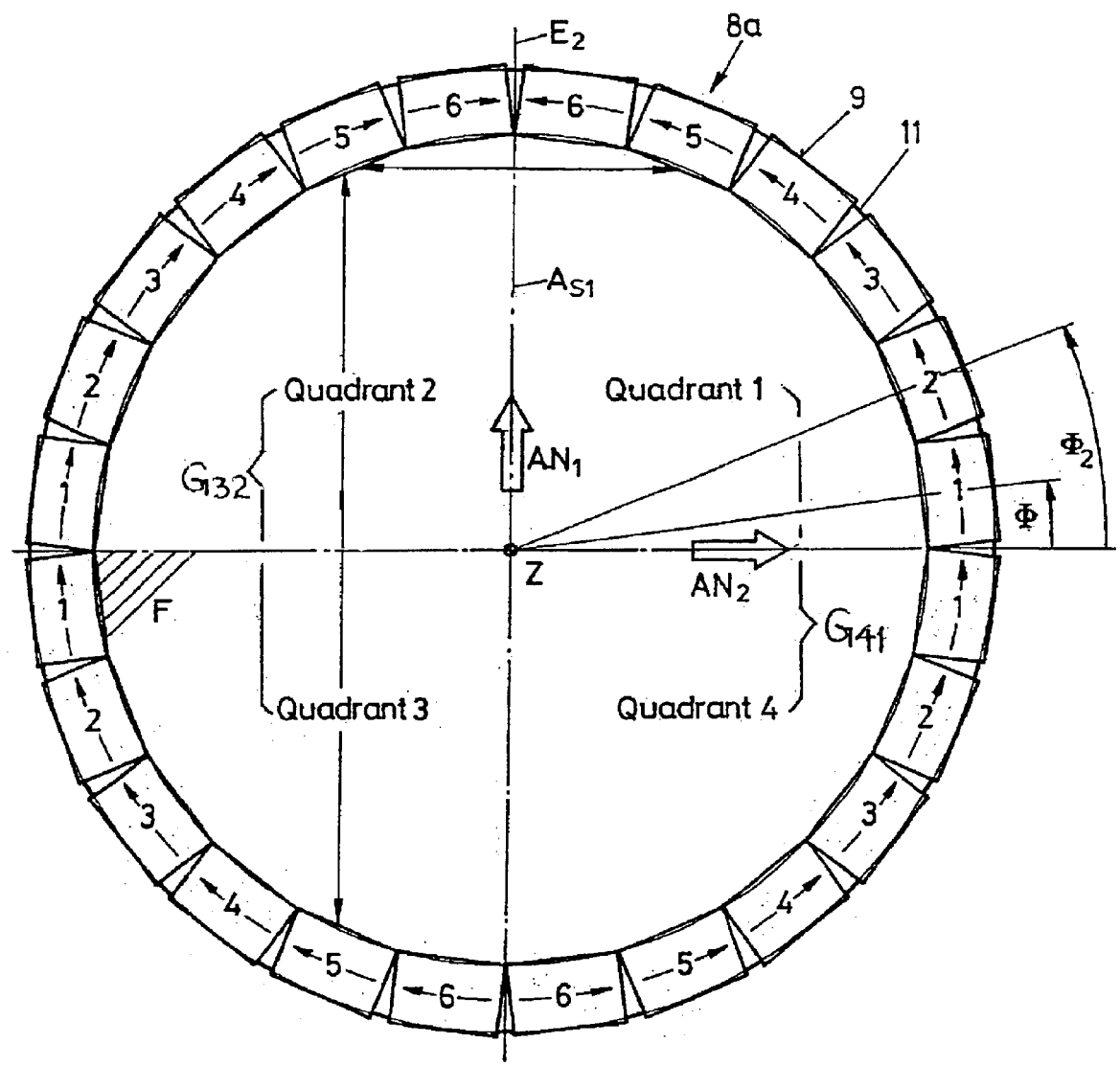

In FIG. 3 is depicted a preferred realization of the magnet arrangement $8a$ according to the invention or its electromagnets 9 shown in a view according to FIG. 2, in particular for the realization of a magnetic anisotropy on a magnetic layer, sputtered on, for example, according to FIG. 1, with collinear field lines to a large degree over the entire substrate extent, with an angular deviation from ideal parallelity of maximally ±5°, preferably maximally ±3°, preferably even maximally ±2°.

The magnet arrangement depicted in FIG. 3 comprises an even number of magnets 9 formed by coils on a common toroidal core 11. By Z is denoted the center of the magnet arrangement—here the toroidal core—which in the case of coating centered substrates, such as in particular circular or rectangular or square ones, is disposed in the center axis, indicated here in FIG. 1 by M, of the substrate 3.

If, on the substrate mounting 1 according to FIG. 1, more than one substrate is disposed, these are preferably grouped centrally about the axis M and correspondingly, in view of FIG. 3, about axis Z.

As is evident in FIG. 3, the coils of the magnets 9 per quadrant are numbered consecutively 1 to 6. Furthermore, in FIG. 3 are entered the preferably employed dipole directions. As can be seen, the even number of overall provided electromagnets 9 is divided into two groups by a plane $E_2$ which contains the axis Z and of which in FIG. 3 only the axis $A_{S1}$ is evident. Each group, namely, on the one hand, the electromagnets 9 contained in quadrants 1 and 4 as well as, on the other hand, the magnets 9 contained in quadrants 2 and 3, generate dipoles with a direction component parallel to planes $E_2$ and E (according to FIG. 1), which on both groups are directed uniformly.

However dipole direction components perpendicular to said component, thus in direction $AN_2$ according to FIG. 3, i.e. perpendicular to plane $E_2$ in the one group $G_{41}$, for quadrants 1 and 4 are directed inversely to the corresponding direction components of the dipoles in group $G_{32}$ with quadrants 2 and 3. Furthermore the values of said dipoles are laid out to be of different magnitude, which is realized by providing different winding numbers on the coils of the electromagnets 9 and/or by driving the electromagnet coils of identical or different winding numbers with correspondingly dimensioned different currents. In the embodiment depicted in FIG. 3 the values of the magnetic dipole on the groups of associated electromagnet coils, as is evident, are selected to be mirror symmetric with respect to plane $E_2$ or axis $A_{S1}$.

In the following Table the coils are numbered as follows:

$Q_{x,y}$, where x denotes the quadrant number and y the coil number according to FIG. 3.

Normalized to the value of the lowest coil field strength in a quadrant, in the following Table—for the generation of an anisotropy in the direction $\phi=0°$, i.e. in the direction of AN2 in FIG. 3 as well as for an anisotropy direction rotated by 90° with respect to it, according to AN1—are compiled the field strength values or dipole strengths to be generated per coil.

The values and directions of the magnetic dipoles, with $\phi$ as polar spatial coordinate of the particular electromagnet coil under consideration, are preferably laid out at least approximately proportional to the function $\cos \phi$.

The different field strength values and therewith dipole values at the particular coils—as stated—can be realized by providing different winding numbers on the coils, corresponding to the weighting factors compiled in said Table and/or by the loading of the coils with currents corresponding to the weighting factors. Preferably either coils with identical winding numbers and weighting by loading with different currents are selected or coils with different winding numbers loading with identical currents. But a mixed form is entirely possible.

TABLE 1

| Quadrant Number Coil Number | Anisotropy Direction at $\phi = 0°$ | Anisotropy Direction at $\phi = 0°$ |
|---|---|---|
| $Q_{11} = Q_{21} = Q_{31} = Q_{41}$ | 1 | 7.56 |
| $Q_{12} = Q_{22} = Q_{32} = Q_{42}$ | 2.92 | 7.05 |
| $Q_{13} = Q_{23} = Q_{33} = Q_{43}$ | 4.65 | 6.05 |
| $Q_{14} = Q_{24} = Q_{34} = Q_{44}$ | 6.05 | 4.65 |

TABLE 1-continued

| Quadrant Number Coil Number | Anisotropy Direction at $\phi = 0°$ | Anisotropy Direction at $\phi = 0°$ |
|---|---|---|
| $Q_{15} = Q_{25} = Q_{35} = Q_{45}$ | 7.05 | 2.92 |
| $Q_{16} = Q_{26} = Q_{36} = Q_{46}$ | 7.56 | 1 |

It is now readily apparent that by redirecting of the currents charging the coils of the electromagnets 9 the position of plane $E_2$ according to FIG. 3 can be rotated. If, for example, the weighting of the dipoles takes place through corresponding current dimensioning such that for said cos $\phi$ function the zero angle is at $\phi_2$, a corresponding dipole polarity reversal results at coils $Q_{25}$, $Q_{26}$ and $Q_{46}$, $Q_{45}$ with the result of a pivoting of the direction of the collinear field and therewith also of the generated collinear anisotropy by $\phi_2$. By redirecting of the current generators driving the coils said direction can be electrically redirected in discrete preselected steps or, incrementally from coil to coil, from 0° to 360° with respect to axis Z.

Figure 4:
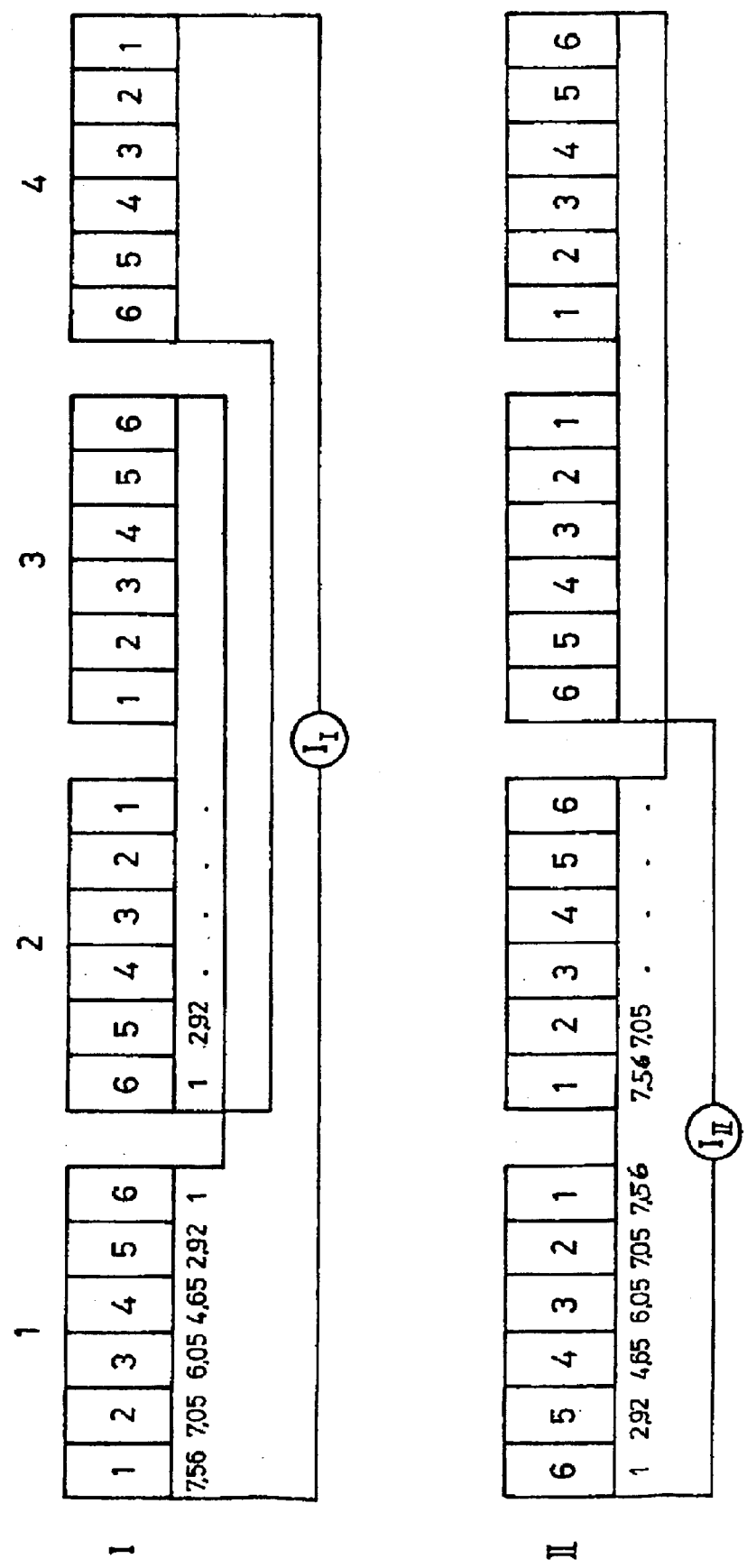
Figure 5:
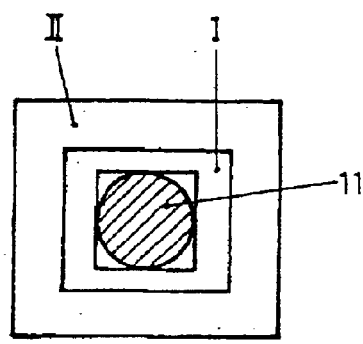

A further realization form is depicted in FIGS. 4 and 5.

In this realization form the switching over of the anisotropy direction, for example from AN1 to AN2 according to FIG. 3, is realized thereby that on the same core 11 according to FIG. 3, preferably coaxially with the core axis, in each instance two, optionally—for more than two switchable anisotropy directions—more than two coils are wound. This is shown schematically in FIG. 5 with toroidal core 11 in cross section and the coil of set I and, coaxially with it, the coil of set II.

The winding numbers for the coils and their circuitry are evident in FIG. 4.

Figure 6:
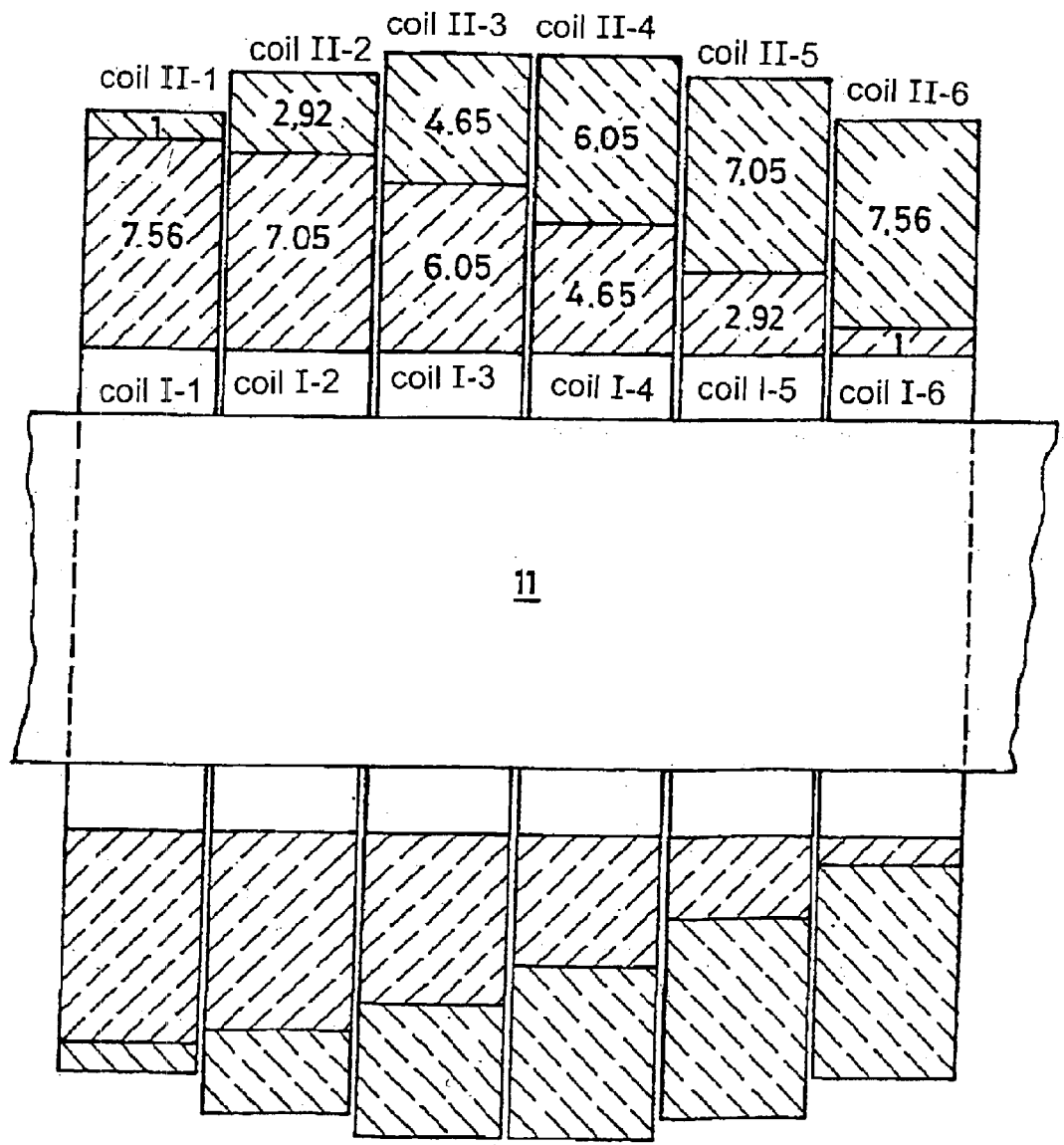

In FIG. 6 this is schematically shown for one of the quadrants. The weighting factors specified in the above Table are also entered here.

The second principle in pure form is that of the current weighting with coils with identical winding number.

Figure 7:
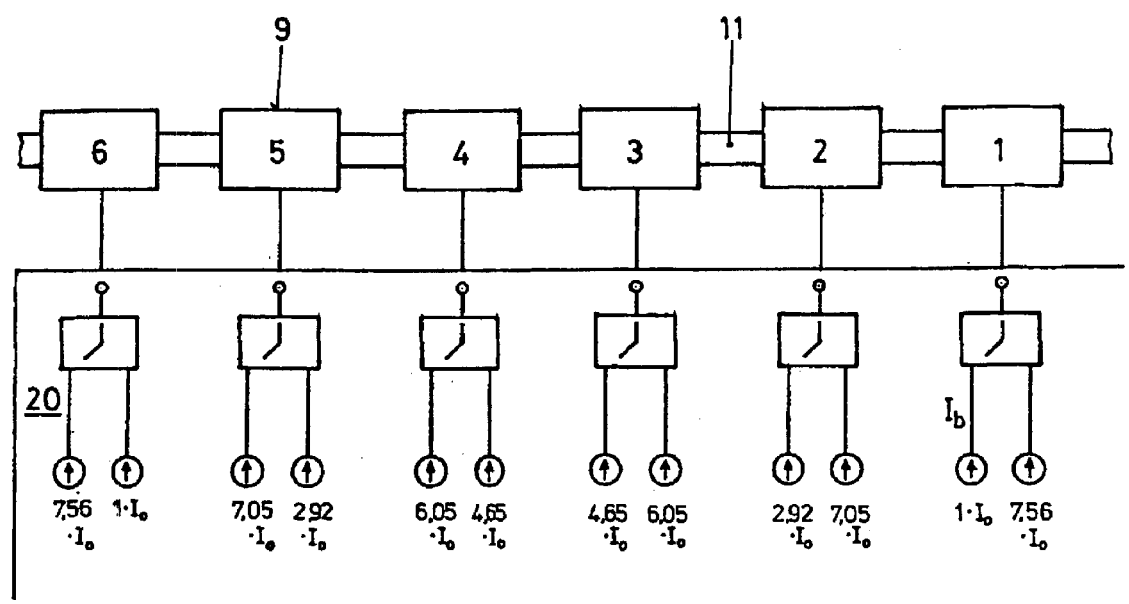

According to FIG. 7 in this case the coils are supplied via a current distribution electronics 20 with the weighted current values. It must be emphasized that for the realization of the current switching on unit 20 many feasibilities are open to a person skilled in the art, and that the weighting factors listed in FIG. 7 in analogy to the Table are intended to have only explanatory character.

In the case of this procedure the switching from the generation of the one anisotropy direction, for example AN1, to the second one, for example AN2 according to FIG. 3, is simple without needing to provide a second coil set only by switching over the coil currents.

Instead of six coils for each quadrant, it is understood that, depending on the requirements made of the precision to be attained of the actual anisotropy distribution with respect to a predetermined nominal anisotropy distribution, more or fewer coils can be provided.

With the arrangement depicted in FIG. 3, dimensioned according to the Table and with outer diameter $\theta=450$ mm, circular plate-form substrates having a diameter $\theta_S=150$ mm and $\theta_S=200$ mm were magnetized during the production of a layer comprised of Permalloy. Coils of identical winding number were utilized with different current strengths and current directions in the individual coils.

The current strengths were realized substantially according to the weighting factors specified in the Table. The distance between the dipole axes in one plane to the surface to be coated of the planar circular plate-form substrates was 70 mm. The substrates were comprised of silicon.

Figure 8:
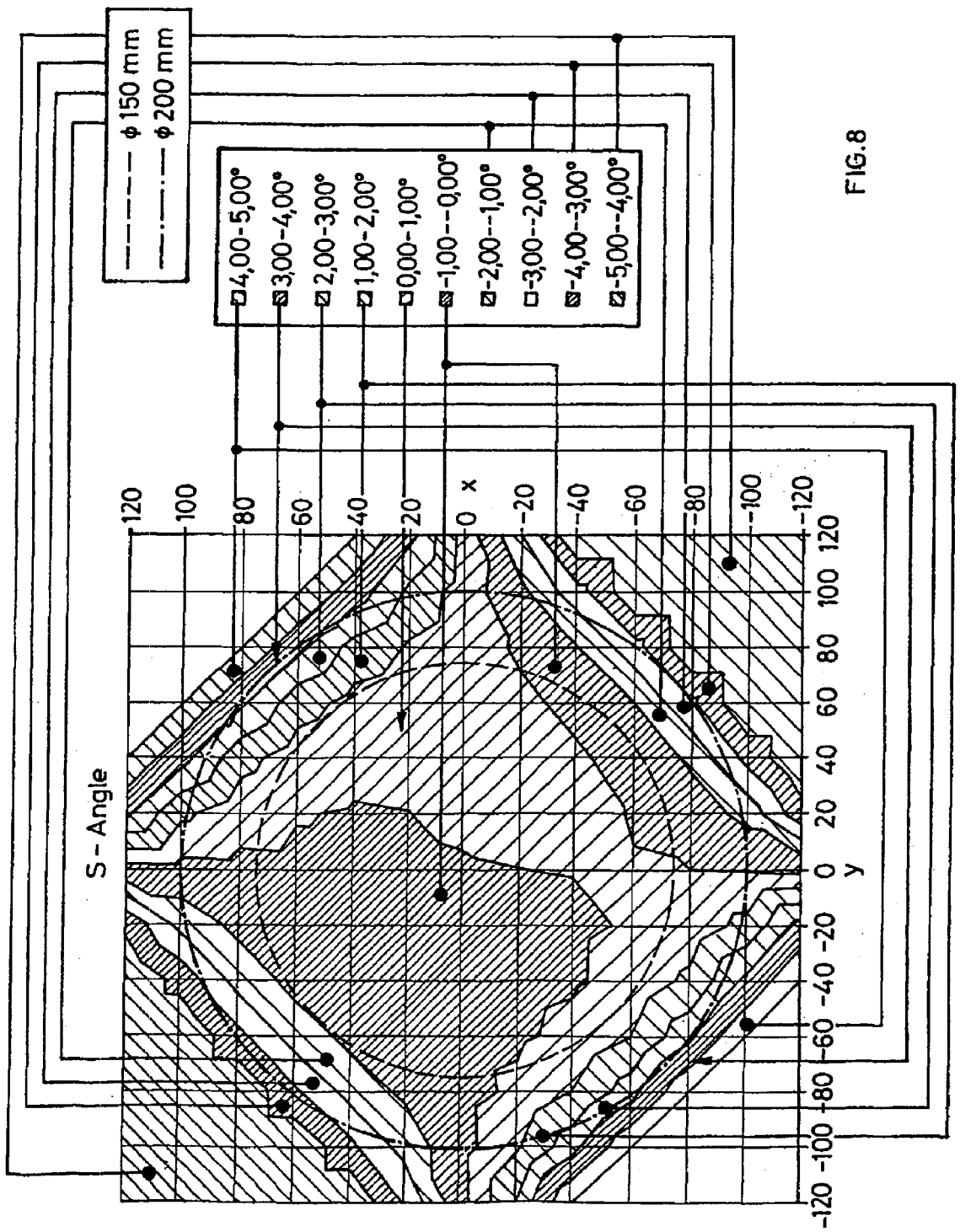

In FIG. 8 the measured direction of the field lines is depicted as a function of the location. Accordingly, for substrates with $\theta_S=150$ mm a maximum deviation of the anisotropy direction from the nominal direction results of maximally ±1°.

For substrates with $\theta_S=200$ mm the maximum deviation is maximally ±3°.

Figure 9:
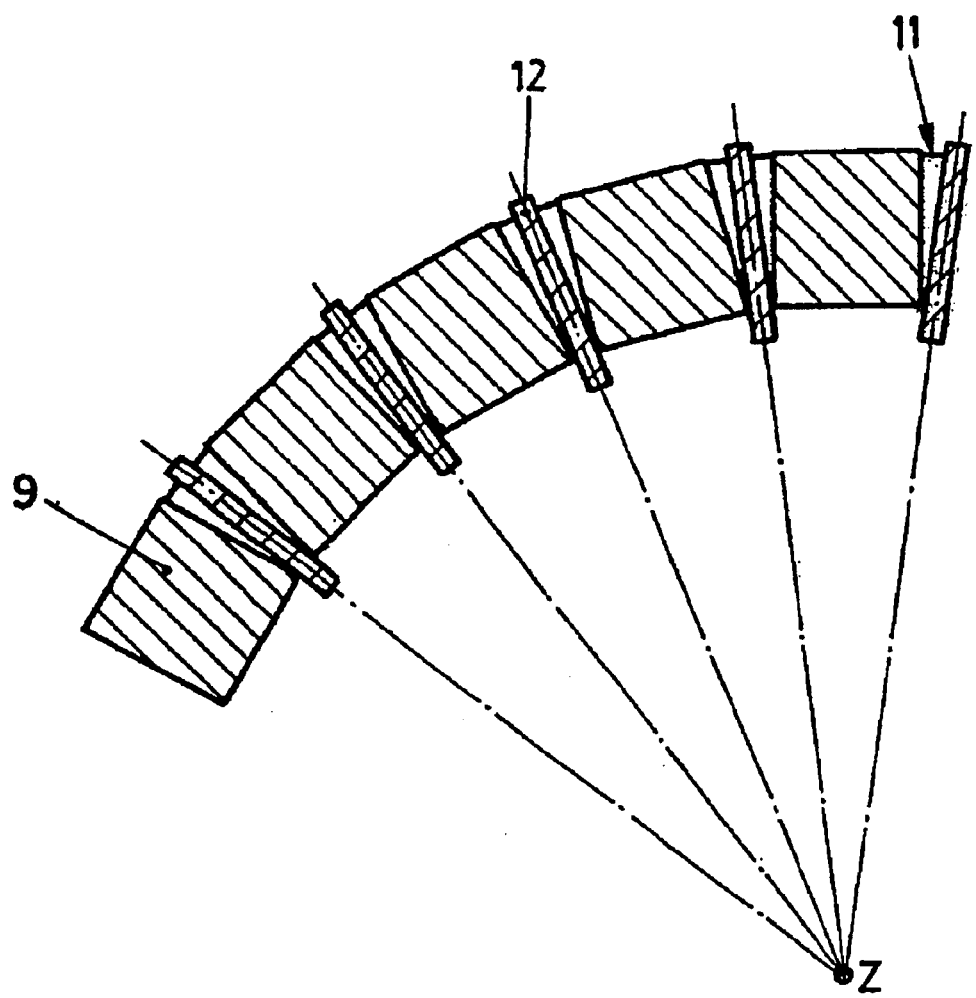
Figure 10:
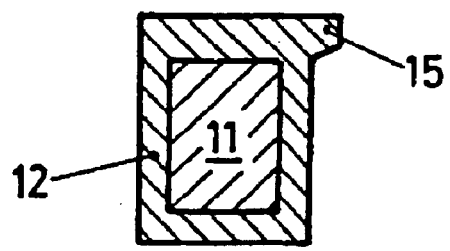

In FIG. 9 the segment of a further preferred embodiment of the arrangement according to the invention is shown. Coils 9 are therein wound in a manner described previously onto a toroidal core 11. Between the coils 9 flux guidance pieces 12 of iron are emplaced according to FIG. 10. They comprise in each instance flux guidance noses 15 directed toward the center Z. By providing these flux guidance pieces 12, with otherwise identical currents through coils 9, a stronger magnetic field is attained, but which also has the desired collinear anisotropy or collinear anisotropy distribution.

Through the proposed technique it becomes possible to rotate without mechanical devices in particular collinear magnetic fields relative to a substrate. Collinear field domains are attained on substrates along the most essential substrate areal regions, and this is attained on large-area substrates or circular plate-form or square ones.

What is claimed is:

1. Arrangement for orienting the magnetization direction of magnetic layers on plate-form substrates with a substrate mounting (1) for at least one substrate (3), which defines a positioning plane (E) for the at least one substrate, a magnet arrangement on one side of the positioning plane (E), characterized in that the magnet arrangement comprises at least three electromagnets (9), whose dipole axes (A) are at least approximately parallel to the positioning plane (E) and, viewed perpendicularly to the positioning plane, define a closed surface (F).

2. Arrangement as claimed in claim 1, characterized in that the dipole axes (A) define a n-polygon as surface (F).

3. Arrangement as claimed in claim 1, characterized in that an even number of electromagnets (9) is provided.

4. Arrangement as claimed in claim 1, characterized in that the magnet arrangement comprises two electromagnet groups, at which electromagnets generate dipoles directed as follows:

the dipoles have first components, parallel to the positioning plane and in a first direction, which in both groups are directed uniformly, the dipoles have second components, parallel to the positioning plane and in the direction perpendicular to the first, which in the one group are directed inversely to those of the second group.

5. Arrangement as claimed in claim 1, characterized in that the electromagnets (9) are formed by coils wound onto a common magnetic core (11) enwrapping the surface (F).

6. Arrangement as claimed in claim 5, wherein the magnetic core is a toroidal core.

7. Arrangement as claimed in claim 1, characterized in that the electromagnets are connected to current generators which charge the electromagnets with at least one of: DC current; AC current; and DC+AC current at a frequency f of, $1\ Hz \leq f \leq 100\ Hz$.

8. Arrangement as claimed in claim 1, characterized in that at least a portion of the electromagnets are connected to current generators which charge the electromagnets with currents, to which applies DC values are different and/or AC amplitudes and/or phases are different.

9. Arrangement as claimed in claim 1, characterized in that the electromagnets are connected to a current generator arrangement on which the distribution of output currents to the electromagnets are switched into at least two different distribution states.

10. Arrangement as claimed in claim 1, characterized in that the electromagnets comprise an even number of coils on a common toroidal core and that a plane of symmetry, which contains the axis (Z) of the core, divides the coils into two groups, in which direction components of the dipoles of the coils of both groups are directed uniformly in a direction parallel to the plane of symmetry and the dipoles have a strength at least approximately proportional to cos $\phi$, with $\phi$ being the polar position angle of a particular coil with respect to axis (Z) of the toroidal core.

11. Arrangement as claimed in claim 10, characterized in that by switching over the distribution of currents flowing through the coils the angular position of the plane of symmetry is pivotable about axis (Z) into predetermined angular positions in a range from 0° to 360° in freely selectable steps.

12. Arrangement as claimed in claim 1, characterized in that the electromagnets (9) are formed by coils which have at least partially different winding numbers.

13. Arrangement as claimed in claim 1, characterized in that the substrate mounting (1) is developed for receiving at least one plate-form substrate and the magnet arrangement is disposed symmetrically to a center axis through the substrate mounting.

14. Arrangement as claimed in claim 1, characterized in that the substrate mounting (1) is developed for receiving at least one plate-form substrate with a maximum diameter 300 mm.

15. Arrangement as claimed in claim 1, characterized in that the magnet arrangement generates in and along the positioning plane (E) of the substrate mounting a collinear magnetic field with field lines which deviate from ideal parallelity by maximally ±5°.

16. Use of the arrangement as claimed in claim 1 for generating a collinear magnetic field in a predetermined plane, with the desired plane being set instead of the positioning plane.

17. Use as claimed in claim 16 for measuring purposes.

18. Arrangement for orienting the magnetization direction of magnetic layers on plate-form substrates with a substrate mounting (1) for at least one substrate (3), which defines a positioning plane (E) for the at least one substrate, at least two magnet arrangements on one side of the positioning plane (E), characterized in that each magnet arrangement comprises at least three electromagnets (9), whose dipole axes (A) are at least approximately parallel to the positioning plane (E) and, viewed perpendicularly to the positioning plane, define a closed surface (F).

19. Arrangement as claimed in claim 18, characterized in that with respect to an axis perpendicular to the positioning plane the magnet arrangements are disposed coaxially and, with respect to the axis, are rotated about an angle, preferably of $\pi/2$, viewed in a plane perpendicular to the axis.

20. Arrangement as claimed in claim 19, wherein the magnet arrangements are identical.

21. Arrangement as claimed in claim 18, characterized in that coils of both magnet arrangements are wound on the same core.

22. Arrangement as claimed in claim 21, wherein the core is a toroidal core.

23. Arrangement as claimed in claim 18, characterized in that the substrate mounting (1) is developed for receiving at least one plate-form substrate and the magnetic arrangements are disposed symmetrically to a center axis through the substrate mounting.

24. Arrangement as claimed in claim 18, characterized in that the substrate mounting (1) is developed for receiving at least one plate-form substrate with a maximum diameter 300 mm.

25. Arrangement as claimed in claim 18, characterized in that the magnetic arrangements generate in and along the positioning plane (E) of the substrate mounting a collinear magnetic field with field lines which deviate from ideal parallelity by maximally ±5°.

26. Vacuum coating installation with a coating chamber (5), characterized in that an arrangement as claimed in one of claims 1 to 15 is provided in the chamber (5) for receiving at least one substrate (3) to be coated.

27. Vacuum coating installation as claimed in claim 26, characterized in that in the chamber (5) at least one sputter source (7) is provided with target comprised of magnetic material.

28. Method for the production of substrates with at least one layer comprised of low retentivity material as well as a nominal distribution of the magnetic anisotropy in the layer, in which during the application of the layer it is exposed to the magnetic field of an electromagnet arrangement, characterized in that the magnetic field is generated by means of an arrangement as claimed in one of claims 1 to 15.

29. Method as claimed in claim 28, characterized in that the desired nominal anisotropy distribution is set by setting the currents flowing through the electromagnets and/or by activating electromagnet coils with specific winding numbers.

30. Method as claimed in claim 28, characterized in that at least one magnetic layer with a collinear magnetic anisotropy direction with an angular deviation of maximally 5° at least over the most essential a real region of the layer would be created.

31. Method as claimed in claim 30, characterized in that at least two layers are created in the substrate, each with said anisotropy in different directions.

* * * * *